(12) United States Patent
Zhang et al.

(10) Patent No.: US 9,635,777 B2
(45) Date of Patent: Apr. 25, 2017

(54) ELECTRONIC DEVICE

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Guang-Yi Zhang, Shenzhen (CN); Qing-Hai Su, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 56 days.

(21) Appl. No.: 14/665,709

(22) Filed: Mar. 23, 2015

(65) Prior Publication Data
US 2015/0271935 A1    Sep. 24, 2015

(30) Foreign Application Priority Data
Mar. 21, 2014 (CN) .......................... 2014 1 0104956

(51) Int. Cl.
*H05K 7/14* (2006.01)

(52) U.S. Cl.
CPC .................................. *H05K 7/1489* (2013.01)

(58) Field of Classification Search
CPC ....... H05K 7/1489; H05K 7/1491; H05K 7/18
USPC ....................................................... 361/724
See application file for complete search history.

(56) References Cited

U.S. PATENT DOCUMENTS

| | | | | |
|---|---|---|---|---|
| 6,373,690 B1* | 4/2002 | Buican | .................... | G06F 1/181 16/223 |
| 6,788,531 B2* | 9/2004 | Chen | ........................ | H05K 7/14 211/26 |
| 7,256,989 B2* | 8/2007 | Liu | .......................... | G06F 1/184 312/223.1 |
| 7,269,020 B2* | 9/2007 | Wang | .................... | H05K 5/0239 312/223.2 |
| 7,448,702 B2* | 11/2008 | Chen | ........................ | G06F 1/181 292/150 |
| 9,173,309 B2* | 10/2015 | Chen | .................... | H05K 5/0221 |
| 2002/0093785 A1* | 7/2002 | Chi | .......................... | G06F 1/183 361/679.02 |
| 2004/0228083 A1* | 11/2004 | Wang | .................... | H05K 5/0239 361/679.02 |
| 2009/0261212 A1* | 10/2009 | Yu | ........................ | H05K 7/1491 248/56 |
| 2013/0077218 A1* | 3/2013 | Zhang | .................. | H05K 7/1489 361/679.02 |
| 2014/0132139 A1* | 5/2014 | Chang | .................. | H05K 7/1489 312/333 |

(Continued)

*Primary Examiner* — David M Sinclair
*Assistant Examiner* — Robert Brown
(74) *Attorney, Agent, or Firm* — Steven Reiss

(57) ABSTRACT

An electronic device includes a chassis having a plurality of sides, a bezel located at an end of the chassis, two fixing members fastened to opposite sides of the chassis, and two slide members. Each slide member is respectively slidably attached to the corresponding fixing member. The bezel is slidably sandwiched between the two slide members. The bezel is configured to rotate relative to the slide members. The bezel includes a pair of hooks formed at two opposite ends thereof and configured to be releasably latched by the two fixing members.

9 Claims, 6 Drawing Sheets

(56) References Cited

U.S. PATENT DOCUMENTS

| | | | |
|---|---|---|---|
| 2015/0201754 A1* | 7/2015 | Chen .................... | A47B 96/025 |
| | | | 248/219.3 |
| 2015/0245709 A1* | 9/2015 | Iwamoto .............. | H05K 7/1489 |
| | | | 211/175 |
| 2015/0271947 A1* | 9/2015 | Zhang .................. | H05K 5/0221 |
| | | | 361/679.01 |

* cited by examiner

ELECTRONIC DEVICE

FIELD

The subject matter herein generally relates to an electronic device.

BACKGROUND

A bezel is mounted on a front end of a chassis of an electronic device. One end of the bezel is rotatably connected to the chassis, and another end of the bezel is latched to the chassis.

BRIEF DESCRIPTION OF THE DRAWINGS

Implementations of the present technology will now be described, by way of example only, with reference to the attached figures.

DETAILED DESCRIPTION

Figure 1:
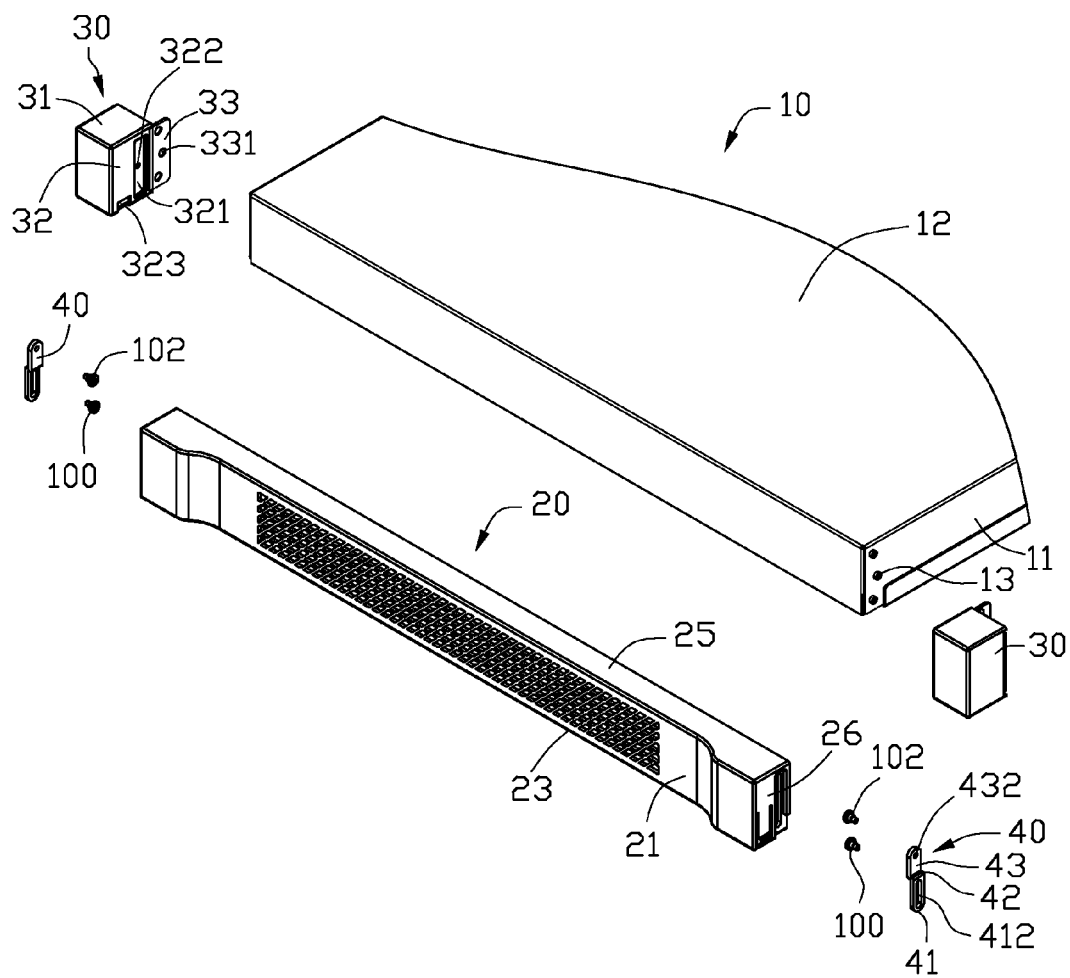
FIG. 1 is an exploded, isometric view of an exemplary embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure relates to an electronic device.

FIG. 1 illustrates an exemplary embodiment of an electronic device. The electronic device comprises a chassis 10, a bezel 20 mounted on a front of the chassis 10, two fixing members 30, and two slide members 40.

The chassis 10 comprises two opposite side walls 11 and a top wall 12 perpendicular to the two side walls 11. A plurality of fixing pins 13 protrude out from a front end of each side wall 11.

Figure 2:
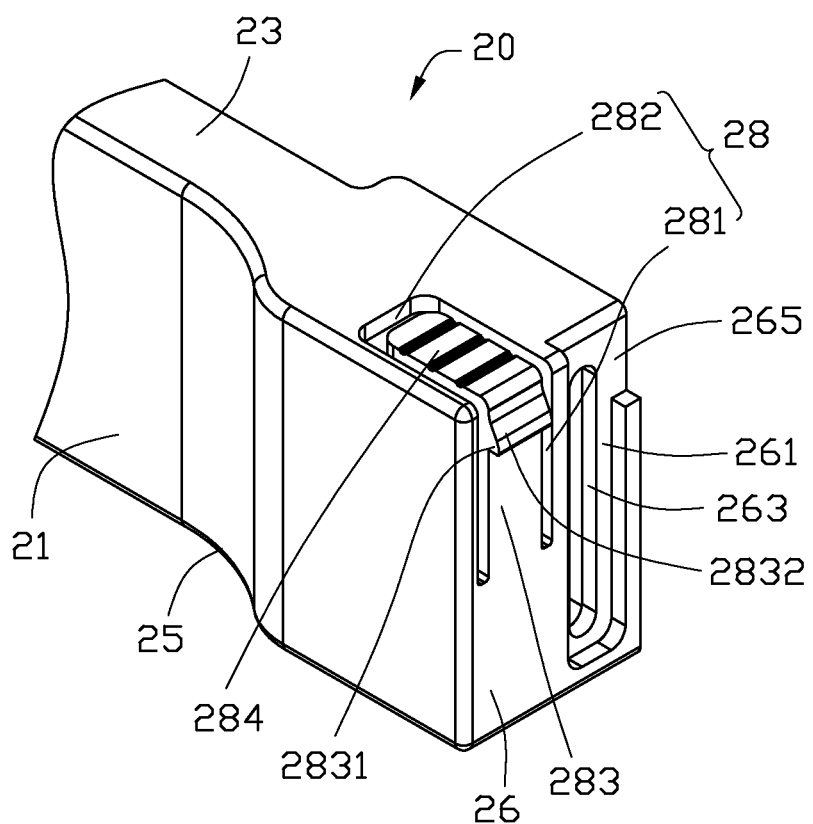
FIG. 2 is a partial, isometric view of a bezel of the electronic device of FIG. 1, but viewed from another angle.

FIG. 2 illustrates a partially isometric view of a bezel of the electronic device. The bezel 20 comprises an elongated base plate 21, a pair of side plates 23 and 25 perpendicularly extending from an upper side edge and a lower side edge of the base plate 21, and two end plates 26 perpendicularly formed at two opposite ends of the side plates 23 and 25. Each of the end plates 26 defines an inverted L-shaped first recessed portion 261 therein and an entrance 265 communicated with a lower portion of the first recessed portion 261. An elongated channel 263 extends through the first recessed portion 261. An L-shaped groove 28 is defined in the bezel 20 beside the first recessed portion 261 and comprises a first portion 281 defined in the end plate 26, and a second portion 282 defined in the side plate 23. The bezel 20 forms a hook 283 in the first portion 281 and an operating member 284 perpendicularly coupled to the hook 283 in the second portion 282. An outside of each hook 283 forms a block 2831 adjacent to the operating member 284. The block 2831 comprises a blocking wall perpendicular to the end plate 26, and a slanting guiding wall 2832 angled with the blocking wall.

Each of the fixing members 30 comprises a main body 31 and a tab 33. The main body 31 comprises a fixing wall 32. The tab 33 extends from the main body 31, coplanar with the fixing wall 32. A notch 323 is defined in a lower portion of the fixing wall 32. An elongated second recessed portion 321 is defined in the fixing wall 32, located between the notch 323 and the tab 33. A fixing hole 322 is defined in the second recessed portion 321. A plurality of fixing apertures 331 is defined in the tab 33.

Each slide member 40 comprises a first piece 41, a second piece 43 parallel to the first piece 41, and a connecting piece 42 perpendicularly connected between the first piece 41 and the second piece 43. The first piece 41 defines an elongated slot 412. An upper end of the second piece 43 defines a locking hole 432.

Figure 3:
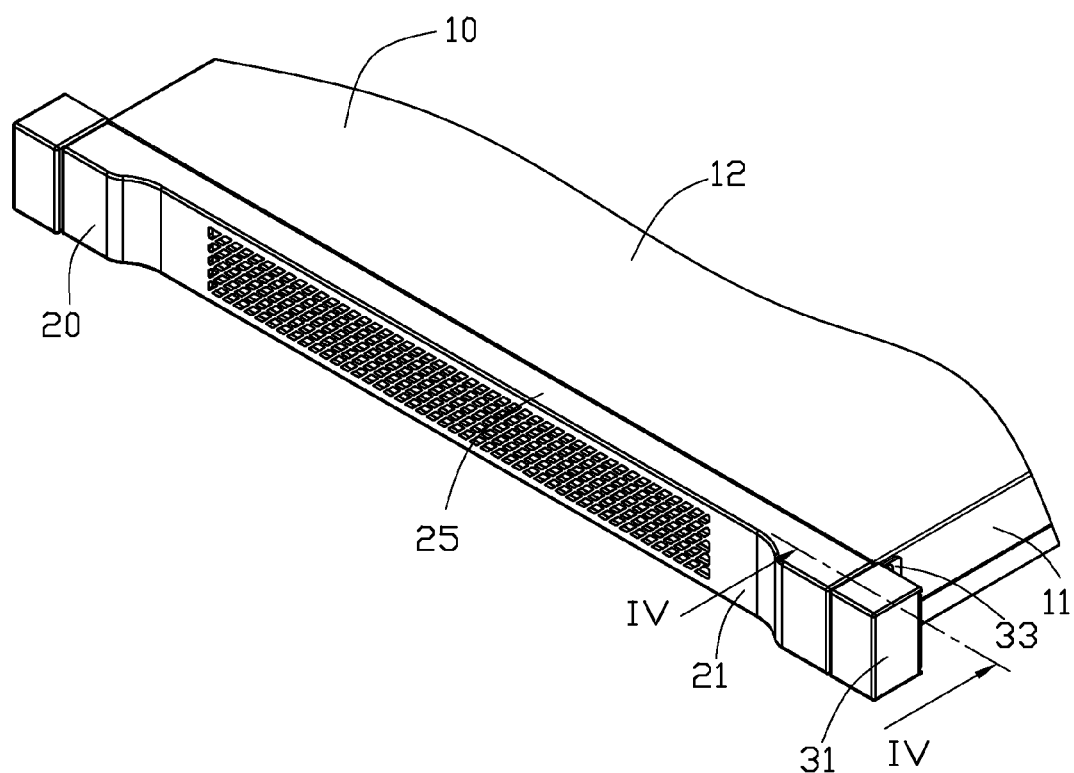
FIG. 3 is an assembled, isometric view of the electronic device of FIG. 1.
Figure 4:
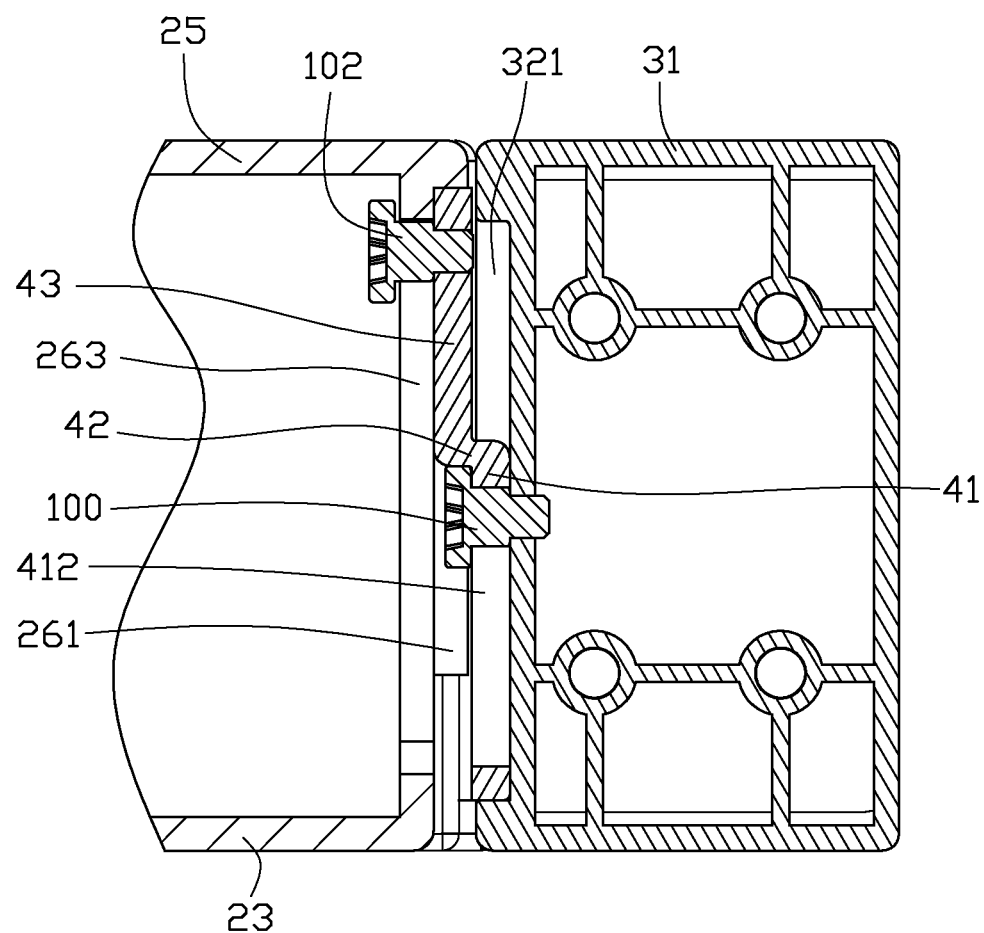
FIG. 4 is a cross sectional view along line IV-IV of FIG. 3.

Referring to FIG. 3 and FIG. 4, in assembly, each slide member 40 is attached to the corresponding fixing member 30 and the bezel 20. The first piece 41 of the slide member 40 is received in the second recessed portion 321 of the fixing member 30 and a fastener 100 extends through the slot 412 to engage in the fixing hole 322. The second piece 43 of the slide member 40 is received in the first recessed portion 261 of the bezel 20 and a fastener 102 extends through the channel 263 to engage in the locking hole 432 of the slide member 40. The blocks 2831 of the bezel 20 engage in the notches 323 of the fixing members 30. At this time, the side plates 23 and 25 are parallel with the top wall 12 of the chassis 10. The fixing pins 13 of the chassis 10 engage in the fixing apertures 331 of the fixing members 30 and the bezel 20 is located at a front end of the chassis 10.

Figure 5:
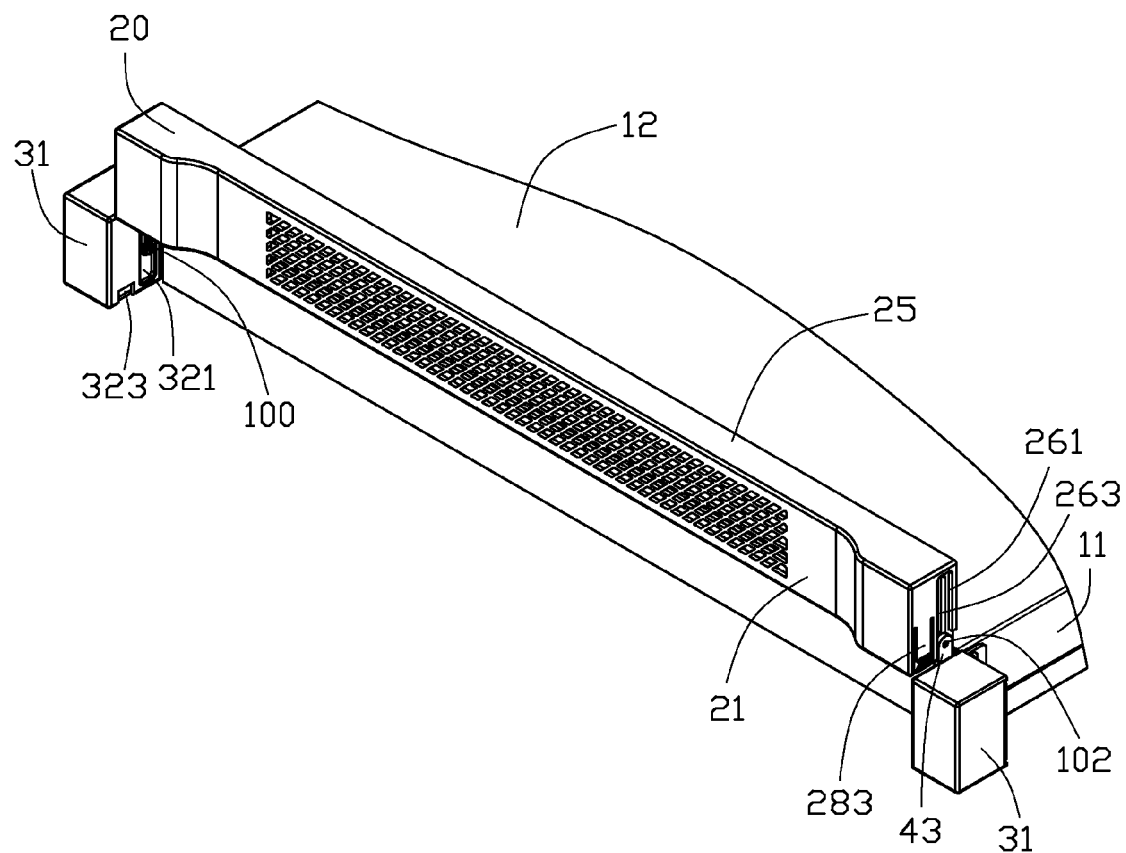
FIG. 5 is an isometric view of FIG. 3, showing the electronic device in a first state.

FIG. 5 illustrates the electronic device in a first state. When the front of the chassis 10 needs to be exposed, the operating members 284 are pressed to release the blocks 2831 of the hooks 283 from the notches 323. The bezel 20 is slid upwards and the fasteners 102 slide in the channel 263 of the bezel 20, until the fasteners 102 are blocked by a bottom end of the channels 263. The bezel 20 is further slid upwards until the fasteners 100 are blocked by the bottom end of the slots 412. At this time, the bezel 20 is located above the chassis 10, and the second pieces 43 are in alignment with the entrances 265.

Figure 6:
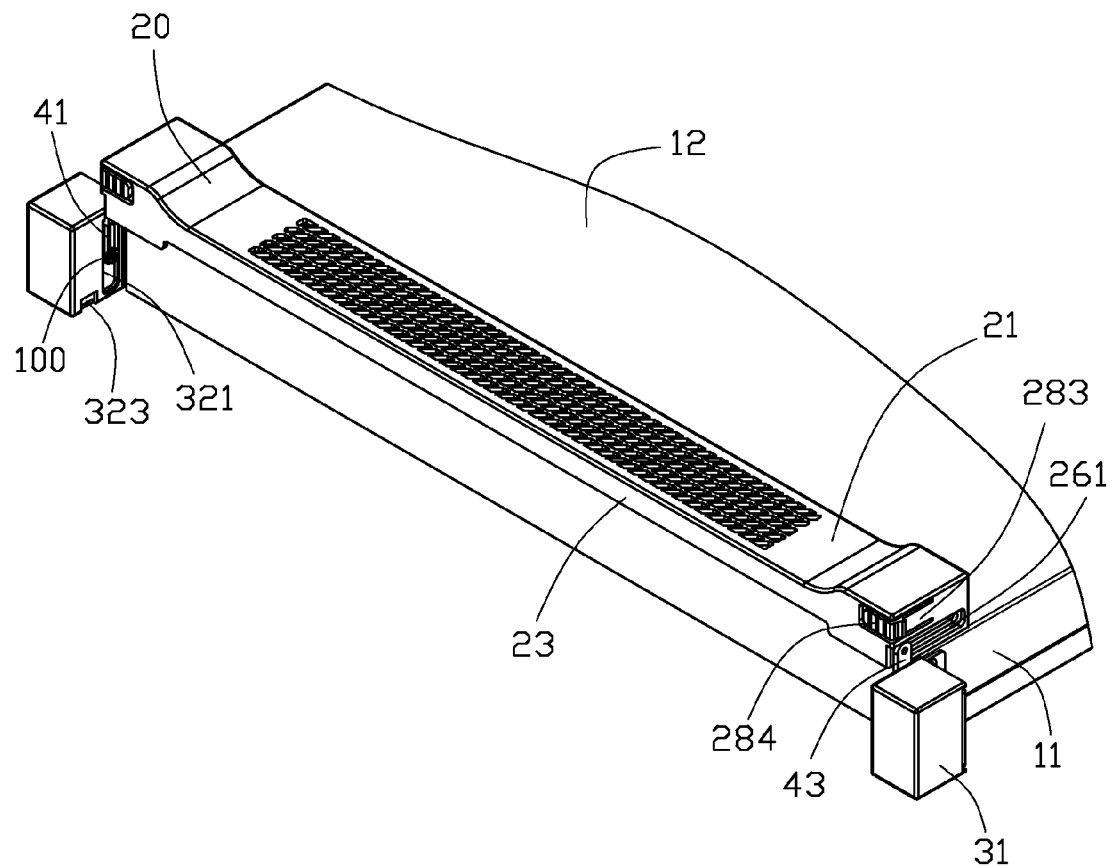
FIG. 6 is similar to FIG. 5, showing the electronic device in a second state.

FIG. 6 illustrates the electronic device in a second state. The bezel 20 is rotated about 90 degrees towards the top wall 12 of the chassis 10. In this state, the side plates 23 and 25 are perpendicular to the top wall 12 of the chassis 10 and the second piece 43 of the slide member is located in the entrance 265.

When the bezel 20 needs to block the front of the chassis 10, the bezel 20 is reversely rotated about 90 degrees away from the chassis 10. Then, the bezel 20 is slid downwards until the fasteners 102 are blocked by a top end of the channels 263 and the fasteners 100 are blocked by the top end of the slots 412 and the blocks 2831 engage in the notches 323 of the fixing members 30.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. An electronic device comprising:
a chassis comprising two opposite side walls and a top wall connected between the two opposite side walls;
two fixing members each fastened to one of the two opposite side walls;
two slide members, wherein each slide member is slidably attached to one of the two fixing members; and
a bezel, the bezel comprising two opposite ends and positioned between the two slide members and slidable towards the top wall, wherein the bezel is configured to rotate relative to the slide members, and wherein the bezel comprises a pair of hooks each hook formed at each of the two opposite ends and configured to be releasably latched by the two fixing members;
wherein the bezel comprises two opposite end plates, one end plate at each opposite end of the bezel, wherein each end plate defines an elongated channel, wherein each of the two hooks is formed beside the channel, a locking hole is defined at each end of each of the two slide members, wherein each of two first fasteners slidably extends through one of the channels to engage in one of the locking holes.

2. The electronic device of claim 1, wherein a slot is defined in the other end of each slide member, each of two second fasteners respectively slidably extends through one of the slots to engage in one of the fixing members.

3. The electronic device of claim 2, wherein each slide member comprises a first piece, a second piece parallel to the first piece, and a connecting piece perpendicularly connected between the first piece and the second piece, wherein the slot is defined in the first piece, the locking hole is defined in the second piece.

4. The electronic device of claim 3, wherein an elongated first recessed portion is defined in each end plate of the bezel to receive the second piece of the slide member, the channel is defined in the first recessed portion, an elongated second recessed portion is defined in each fixing member to receive the first piece of the slide member, and the fixing hole is defined in the second recessed portion.

5. The electronic device of claim 4, wherein the first recessed portion of the bezel is L-shaped, and wherein an entrance is defined by the first recessed portion and configured to receive the second piece of the slide member.

6. The electronic device of claim 4, wherein each fixing member comprises a main body, the main body comprises a fixing wall, a tab extends from the main body and is coplanar with the fixing wall, the fixing walls are attached to each of the opposite sides of the chassis, and the second recessed portion is defined in the fixing wall.

7. The electronic device of claim 6, wherein a notch is defined in each fixing wall, the hook extends from the corresponding end plate of the bezel, and wherein each hook comprises a block extending to engage in the corresponding notch.

8. The electronic device of claim 7, wherein each block comprises a blocking wall perpendicular to the corresponding end plate, and a guiding wall slantingly angled to the blocking wall.

9. The electronic device of claim 7, wherein the bezel comprises a side plate, and each end plate of the bezel defines a groove extending to the side plate, wherein the groove comprises a first portion defined in the end plate and a second portion defined in the side plate, the hook is received in the first portion of the groove, and an operating member is received in the second portion of the groove.

* * * * *